(12) United States Patent
Wallner et al.

(10) Patent No.: US 7,391,657 B2
(45) Date of Patent: **\*Jun. 24, 2008**

(54) SEMICONDUCTOR MEMORY CHIP

(75) Inventors: Paul Wallner, Prien (DE); Martin Streibl, Petershausen (DE); Manfred Menke, Wolfratshausen (DE); Yukio Fukuzo, Munich (DE); Christian Sichert, Munich (DE); Peter Gregorius, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

This patent is subject to a terminal disclaimer.

(21) Appl. No.: 11/751,984

(22) Filed: May 22, 2007

(65) Prior Publication Data

US 2007/0217268 A1    Sep. 20, 2007

Related U.S. Application Data

(63) Continuation of application No. 11/242,150, filed on Oct. 4, 2005, now Pat. No. 7,221,615.

(51) Int. Cl.
*G11C 7/00* (2006.01)
*G11C 8/00* (2006.01)

(52) U.S. Cl. ............ 365/189.05; 365/230.03; 365/230.06; 365/230.08; 365/233

(58) Field of Classification Search ............ 365/230.03, 365/189.05, 230.08, 233, 230.06; 714/763
See application file for complete search history.

(56) References Cited

U.S. PATENT DOCUMENTS

| | | | |
|---|---|---|---|
| 5,369,617 | A | 11/1994 | Munson |
| 5,737,563 | A | 4/1998 | Shigeeda |
| 5,898,623 | A | 4/1999 | Clinton et al. |
| 5,950,223 | A | 9/1999 | Chiang et al. |
| 6,000,007 | A | 12/1999 | Leung et al. |
| 6,028,807 | A | 2/2000 | Awsienko |
| 6,178,517 | B1 | 1/2001 | Bertin et al. |

*Primary Examiner*—Trong Phan
(74) *Attorney, Agent, or Firm*—Edell, Shapiro & Finnan, LLC

(57) ABSTRACT

A semiconductor memory chip includes: a reception interface section for receiving external data, command, and address signals in form of serial signal frames; an intermediate data buffer for intermediately storing write data and, optionally, write data mask bits to be written to a memory cell array; a memory core having a bank organized memory cell array; a decoder section for decoding an address derived from a signal frame received from the reception interface section for writing/reading data in/from one or more memory banks of the memory cell array in accordance with a write/read command within one or more received signal frames; and a frame decoder provided as an interface between the reception interface section and the memory core for decoding one or more commands included in one or more frames and outputting data addresses, command, and read/write access indication signals to the memory core and to the intermediate data buffer.

9 Claims, 3 Drawing Sheets

SEMICONDUCTOR MEMORY CHIP

CROSS REFERENCE TO RELATED APPLICATIONS

This application is a continuation of U.S. patent application Ser. No. 11/242,150 filed Oct. 4, 2005, now U.S. Pat. No. 7,221,615, entitled "Semiconductor Memory Chip," the entire contents of which is hereby incorporated by reference.

FIELD OF THE INVENTION

The present invention relates to semiconductor memory chips and in particular to semiconductor memory chips where data, command, and address signals are transmitted to/from the chips exterior in serial signal frames in accordance with a predefined protocol.

BACKGROUND

To date, conventional semiconductor memory chips such as DRAMs neither employ frames for data transfer nor include a frame decoder. Moreover, conventional semiconductor memory chips widely are operated asynchronously, which results in a number of disadvantages.

In future memory systems and semiconductor memory chips, it is expected that data will be transmitted at very high frequency. The data transfer will likely be ruled by a protocol, and data bits will be organized in frames in accordance with the protocol. After several alignment procedures, for exempla, a data stream is demultiplexed in the memory chip to a lower frequency and ready for evaluation. Such a novel semiconductor memory chip must include a frame decoder to decode the signal frames to: (a) memory relevant commands; (b) system commands; and (c) write data to be intermediately stored in an intermediate data buffer.

In such a system, each frame can contain one or more memory relevant commands. Commands dedicated to the same memory bank can be placed in different frames. For special command types, one frame may even contain commands to different banks which are called interbank commands. Moreover, data has to be synchronized with decoded commands provided from the frame decoder to the memory core. In order to reduce latency, the frame decoder unit is operated at a frequency higher than the actual memory core's operating frequency. This implies a potential risk of data collision when using the same busses.

For such a frame decoder unit several requirements exist. Handling of complex functionality is one such requirement. Compared to conventional semiconductor memory chips such as DRAM chips, the functionality of the proposed semiconductor memory chips is greatly increased. Main building blocks have to be arranged in such a way that safe handling of functional complexity is possible. Further, there is a need for a detailed specification. Interfaces, especially internal ones always represent a potential design risk. A synchronous frame decoder containing major parts of the conventional asynchronous memory chip logic is easier to specify and therefore safer. Verification requirements are another consideration. Higher functional complexity goes along with special verification methods that are beyond transistor level oriented methods. However, the opportunity to employ such methods depends on certain arrangements.

Further, from a plan layout perspective, that is, the arrangement within the chips area of the main memory blocks, namely the memory banks, for the frame decoder which forms a link between the memory banks and the reception interface section a number of restrictions exist: memory banks can be arranged in a split and a grouped manner; and control signals to the memory banks must be placed in such a way that wire length, timing, power consumption and area impact are optimized jointly.

SUMMARY

The present invention provides a semiconductor memory chip of the type described above which fulfills the above requirements and addresses the above restrictions, i.e., in which the main building blocks having an increased functionality can be arranged so that a safe handling for their functional complexity is possible and a synchronous frame decoder containing major parts of the memory logic can be easily specified to have safe operation.

In accordance with an exemplary embodiment of the present invention, a semiconductor memory chip includes:

a reception interface section for receiving external write data, command, and address signals in the form of serial signal frames in accordance with a predefined protocol;

an intermediate data buffer configured to intermediately store write data received from the reception interface section and to be written into a memory cell array;

a memory core including the bank organized memory cell array and a decoder section for decoding an address derived from a signal frame received from the reception interface section for writing/reading data into/from one or more memory banks of the memory cell array in accordance with a write/read command within one or more signal frames received from the reception interface section; and a frame decoder providing an interface between the reception interface section and the memory core and including:

a command type decoding section arranged for decoding the types of one or more commands included in one or more frames and outputting control signals according to each decoded command type;

a memory command evaluator/generator section configured to schedule and prepare single commands for the memory core; an intermediate data buffer command evaluator/generator section configured to schedule and prepare control signals for the intermediate data buffer; and a system command evaluator/generator section configured to prepare and schedule system commands, wherein the memory command evaluator/generator section, intermediate data buffer command evaluator/generator section, and system command evaluator/generator section are operated by control signals received from the command type decoding section in accordance with the decoded type of the commands, and the frame decoder includes an interface to the memory core operating in synchronism therewith by being synchronized together by a frame clock signal.

The reception interface section can further include a (cyclic redundancy check) CRC-bit decoder for evaluating CRC-bits within the signal frames and checking correctness/incorrectness of commands and data in each signal frame, and the frame decoder can further include a wrong command protection unit for releasing to the memory core only commands checked by the CRC-bit decoder as being correct.

The present invention also provides a semiconductor memory chip in which the main building blocks allow a split and grouped arrangement of the memory banks and control signals can be supplied to the memory banks with reduced wire length, reduced timings and power consumption, and the area consumption of the chip can be optimized. Specifically, according to another exemplary embodiment of the present invention, a semiconductor memory chip includes:

a reception interface section for receiving external write data, command, and address signals in the form of serial signal frames in accordance with a predefined protocol;

an intermediate data buffer configured to intermediately store write data received from the reception interface section and to be written into a memory cell array;

a memory core including a bank organized memory cell array and a decoder section for decoding an address derived from a signal frame received from the reception interface section for writing/reading data into/from one or more memory banks of the memory cell array in accordance with a write/read command within one or more signal frames received from the reception interface section; and a frame decoder providing an interface between the reception interface section and the memory core for decoding one or more commands included in one or more frames and outputting control signals in accordance with each decoded command, wherein the frame decoder is configured to generate and issue the control signals to the intermediate data buffer, and the frame decoder and the intermediate data buffer are synchronized together by a frame clock signal and are configured to perform a read operation from the memory banks.

The memory core can have a split bank organization in which the total number of the memory banks is divided into an even number of groups and each group is divided into a first and second part.

Further, the intermediate data buffer can be split into a first part and a second part respectively associated with the first and second parts of the groups of the memory banks, and the control signals are issued from the frame decoder to the first and second parts of the intermediate data buffer as first and second control signals, respectively, wherein the frame decoder and the intermediate data buffer are configured to perform a read operation from one part of the groups of memory banks concurrently with a read operation from the other part of the groups of memory banks. The total number of memory banks can be divided into two groups, wherein the two groups are respectively arranged at the left and right side of a first partitioning line running in a first lateral direction of the memory chip. That is, the first partitioning line running in the first lateral direction of the memory chip can be a first symmetry line defining a mirror symmetry between the two groups of memory banks.

The first and second parts of the groups and the first and second parts of the intermediate data buffer are respectively arranged at the left and right side of a second partitioning line running in a second lateral direction substantially perpendicular to the first lateral direction. That is, the second partitioning line can be a second symmetry line defining a mirror symmetry of the first and second part of the groups and the first and second part of the intermediate data buffer, and the second symmetry line is substantially perpendicular to the first symmetry line (running in the first lateral direction). It is to be understood that the first and second partitioning (symmetry) lines are imaginary lines and not physically present. The frame decoder and the first and second part of the intermediate data buffer can be respectively arranged between the two groups of the memory banks, and the frame decoder can be arranged between the first and second part of the intermediate data buffer.

The frame decoder can include: a command type decoding section configured to decode the types of one or more commands included in one or more frames and outputting control signals according to each decoded command type; a memory command evaluator/generator section configured to schedule and prepare single commands for the memory core; an intermediate data buffer command evaluator/generator section configured to schedule and prepare control signals for the intermediate data buffer; and a system command evaluator/generator section configured to prepare and schedule system commands, wherein the memory command evaluator/generator section, intermediate data buffer command evaluator/generator section, and system command evaluator/generator section are operated by control signals received from the command type decoding section in accordance with the decoded type of the commands, and the frame decoder includes an interface to the memory core operating in synchronism therewith by being synchronized together by the frame clock signal. The reception interface section can further include a CRC-bit decoder configured to evaluate CRC-bits within the signal frames and to check correctness/incorrectness of commands and data in each signal frame, and the frame decoder can further include a wrong command protection unit for releasing to the memory core only commands checked by the CRC-bit decoder as being correct.

According to the above, the present invention provides a novel semiconductor memory chip which, in accordance with its first aspect, includes a frame decoder architecture considering major memory and protocol related logic parts in a fully synchronized manner. The advantages of this approach are: major logic parts are integrated and belong to the same functional block; specification of interfaces is simplified due to the synchronous operation; verification opportunities are improved due to the synchronous operation; and partitioning of the functional blocks is performed in consideration of the functional aspects.

Further the present invention provides a semiconductor memory chip in which, in accordance with its second aspect, main parts of the memory logic are now under a synchronous regime and in which the memory bank can be accessed with control signals in a very effective way. This approach has the major advantage that in addition to the above advantages, the routing of the signals to the memory banks can be optimized regarding power, timing and wire length restrictions.

The above and still further objects, features and advantages of the present invention will become apparent upon consideration of the following definitions, descriptions and descriptive figures of specific embodiments thereof wherein like reference numerals in the various figures are utilized to designate like components. While these descriptions go into specific details of the invention, it should be understood that variations may and do exist and would be apparent to those skilled in the art based on the descriptions herein.

BRIEF DESCRIPTION OF THE DRAWINGS

The accompanying drawings, which are incorporated in and constitute a part of the specification illustrate presently preferred embodiments of the invention and together with the general description given above and the detailed description given below serve to explain the principles of the invention.

DETAILED DESCRIPTION

Figure 1:
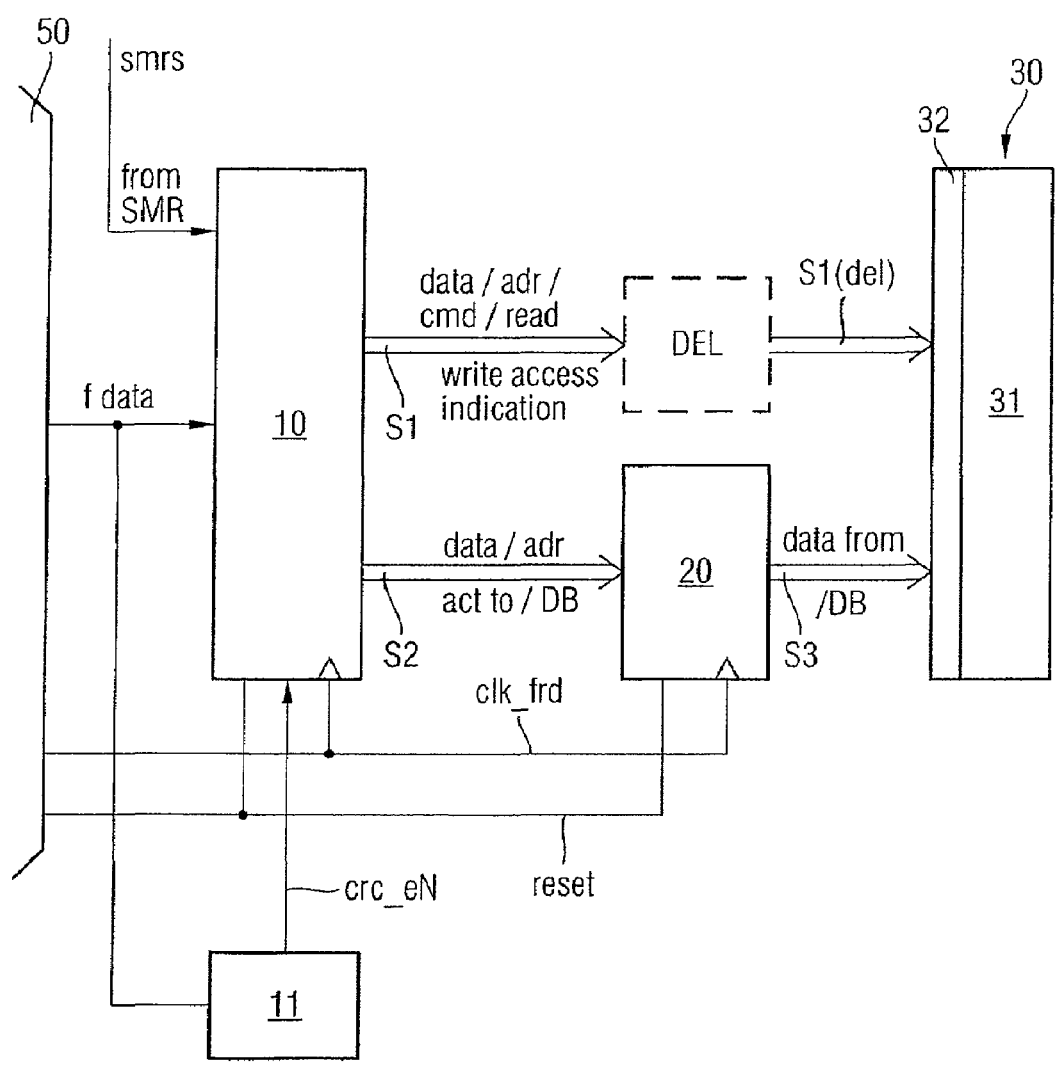
FIG. 1 is a general overview of a section of the reception path within a semiconductor memory chip of the present invention which includes a frame decoder and an intermediate data buffer forming a link between a memory core and a reception interface section.

According to FIG. 1, which depicts a first aspect of the present semiconductor memory chip, a frame decoder 10 is provided as an interface between a reception interface section 50 and a memory core 30. Further an intermediate data buffer (IDB) 20 is arranged in the reception signal path between the frame decoder 10 and the memory core 30 for intermediately storing a plurality of write data units from frames decoded by the frame decoder 10.

Further, FIG. 1 shows a CRC-bit decoder 11 being arranged after the reception interface section 50 for evaluating CRC-bits within the signal frames and checking correctness/incorrectness of command(s) and data in each signal frame. The CRC-bit decoder 11 issues a signal "CRC-ERR" when an error is detected in the command(s) and data, the signal "CRC-ERR" being supplied to the frame decoder 10.

Figure 2:
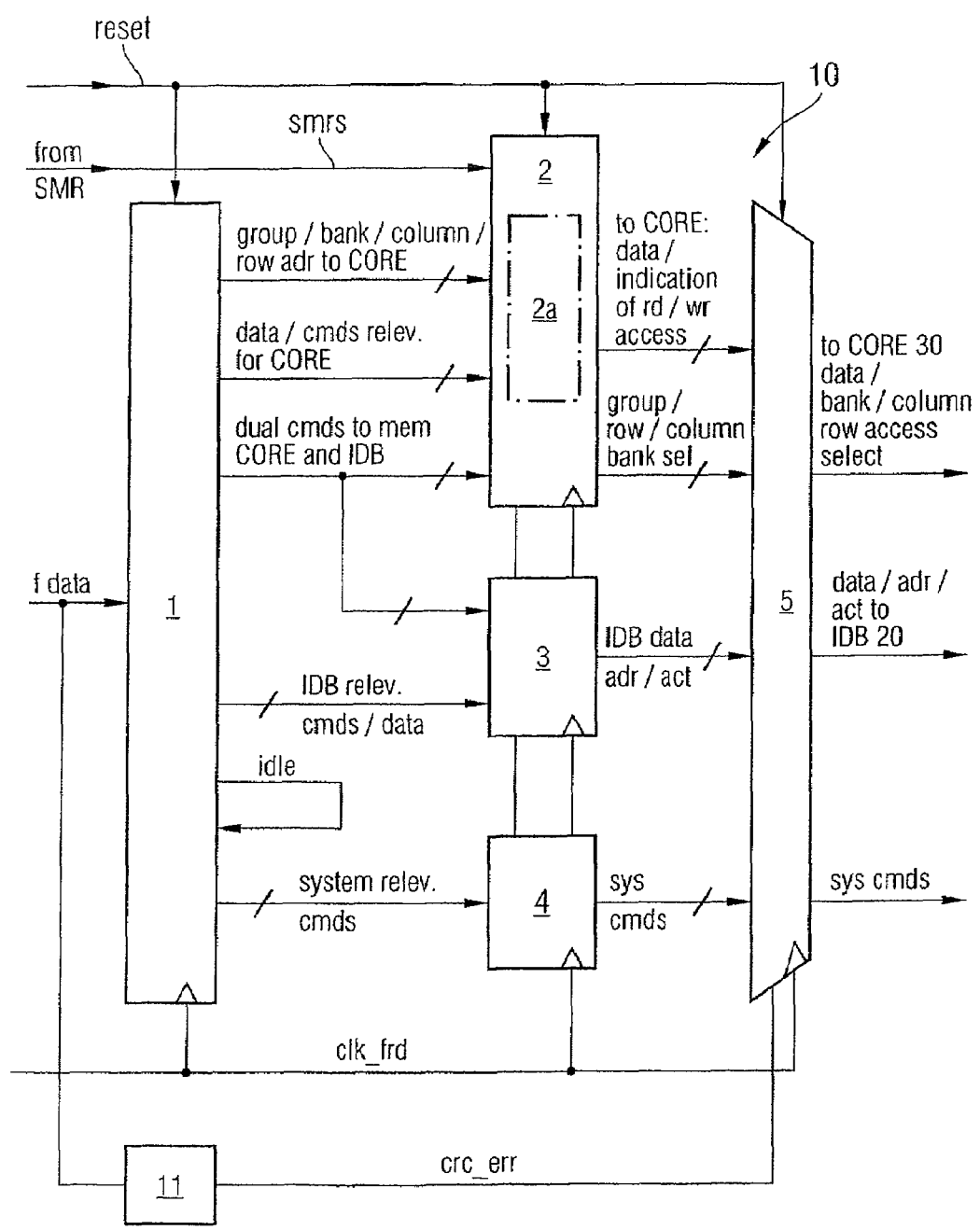
FIG. 2 depicts a more detailed functional block diagram of the frame decoder unit depicted in FIG. 1.

The frame decoder 10 receives frame data fdata from the reception interface section 50 and system information and timing parameters smrs from a system mode register SMR (not shown) and is adapted for decoding one or more commands included in one or more frames and outputting in accordance with each decoded frame data, address and command signals as well as control signals S1 (data/adr/cmd) forming a read/write access indication (read/write access indication to the memory core 30, e.g., as shown in FIG. 2 (to CORE 30 data/bank/column row access select). Further, the frame decoder 10 supplies write data, IDB address signals and activate signals S2 (data/adr/act to/DB) to the intermediate data buffer 20, e.g., as shown in FIG. 2 (data/adr/act to IDB 20). Write data signals intermediately stored in the IDB 20 and, optionally, write data mask bits are supplied as signals S3 (data from/DB) from the IDB 20 to the memory core 30. The operation of the blocks 10, 20 and the transfer of the signals S1, S2 and S3 are synchronous to a frame clock signal clk_rd. It is, however, to be noted that the reading of the system information and timing parameters from the SMR is an optional solution. Such values can also be delivered within the frame accompanying the normal command addresses.

The manner of CRC-bit evaluation (crc eN) by the CRC-bit decoder 11 and other system commands are not part of the novelty of the present invention and are therefore not discussed here in detail because this does not affect the principle functionality. Likewise, the widths of the busses carrying f data and the signal streams S1, S2 and S3 are not critical to the present invention.

It is possible to calculate the IDB address for writing to IDB 20 by a fixed algorithm or to receive the address from a memory controller (not shown). Addresses and control signals to IDB 20 are based on the function of a IDB control logic which can be located in the frame decoder 10 or alternatively in the IDB 20. In the present embodiment, it is assumed that the control logic for generating addresses and control signals S2 to IDB is located in the frame decoder 10.

The intermediate storage of write data mask signals within the IDB 20 is an optional protocol approach. It is also possible to provide the data mask information directly by the frame decoder 10 to the memory core 30. A functional block DEL indicated by broken lines is provided for delaying read commands by a number of clock cycles which are aligned with time to read out data from the IDB 20 to synchronize read command and write data intermediately stored in the IDB 20.

As mentioned, the frame data fdata enter the frame decoder 10 with the frequency of the frame clock signal clk_frd. In the frame decoder 10, the type of command is decoded. Based on the decoded command type, write data are written/read to/from IDB 20 and memory commands are provided to the banks of the memory core 30. Main parts of the memory control logic are now under a synchronous regime. The most important aspect of this synchronous regime is the synchronism of the frame decoders interface to the memory core. Inside the frame decoder, the synchronous operation is an optional solution. There are some blocks inside the frame decoder which can be purely combinatorial. Forcing a synchronous behavior between them would cost additional latency.

As further depicted in FIG. 1, the memory core 30 includes the memory banks 31 and a decoder section 32. FIG. 1 further shows a reset signal "reset" supplied from the reception interface section 50 to the frame decoder 10 and the IDB 20 for carrying out a simultaneous reset action.

Main functional blocks of the frame decoder 10 depicted in FIG. 2 are a command type decoding section 1 arranged for decoding the types of one or more commands included in one or more frames and outputting control signals according to each decoded command type. As shown in FIG. 2, these control signals include a group-, bank-, column- and row addresses to the memory core 30 (group/bank/column/row adr to CORE) concerning data and commands relevant for the core (data/cmds relev. for CORE), dual commands to the memory core and to IDB 20 (dual cmds to mem CORE and IDB), IDB relevant commands and write data IDB relev. cmds/data. The control signals and data and command signals relevant for the memory core 30 as well as the dual commands to the memory core are supplied from the command type decoding section 1 to a memory command evaluator/generator section 2, while the IDB relevant commands and data signals are supplied from the command type decoding section 1 to an intermediate data buffer command evaluator/generator section 3, and system relevant commands (system relev. cmds) are supplied from the command type decoding section 1 to a system command evaluator/generator section 4.

The memory command evaluator/generator section 2 is arranged for scheduling and preparing of single commands to the memory core 30 and includes a buffer 2a implementing the delay action of the block DEL in FIG. 1. The memory command evaluator/generator section 2 supplies to the memory core 30 data and indication signals of read/write access (to CORE: data/indication of rd/wr access) as well as group-, row-, column- and bank select signals (group/row/column/bank sel).

The intermediate data buffer command evaluator/generator section 3 is arranged for scheduling and preparing of control signals as well as data to the IDB 20 (IDB data-, address- and activation signals).

The system command evaluator/generator section 4 is arranged for preparing and scheduling of system commands (sys cmds) relevant for system management, for example access to the system mode register SMR (not shown) or power down action. It is to be mentioned that idle command (idle) frames do not require further action. Within the command type decoding section 1, the memory command evaluator/generator section 2, the intermediate data buffer command evaluator/generator section 3, and the system command evaluator/generator section 4 the frame data are processed in such a way that externally no greater control logic is necessary. For the memory command evaluator/generator section 2, the intermediate data buffer command evaluator/generator section 3 and the system command evaluator/generator section 4, this means that their output is aligned to the frame clock signal clk_frd and has the correct timing considering all relevant memory restrictions.

Concurrently with the operation of the frame decoder 10, the CRC information provided with the frame data fdata is checked by the CRC-bit decoder 11 which is provided for checking correctness/incorrectness of commands and data in each signal frame. The check of the CRC information in the frame is based on the data bits in the frame by applying a certain binary polynomial.

The final stage within the frame decoder 10 is a wrong command protection circuit 5. This is a multiplexer-register unit which releases the previously generated commands aligned to the frame clock edge, and the CRC-ERR signal supplied from the CRC-bit decoder 11 serves as an enable-disable signal. A CRC error locks the frame decoder 10 for certain actions (for example memory commands are no longer provided to the memory core 30). While FIG. 2 shows the preferred embodiment, the wrong command protection circuit 5 could be located at a different location, for example within each block. IDB 20 is not shown in FIG. 2 but is, as shown in FIG. 1 provided between the frame decoder 10 and the memory core 30.

As mentioned, the widths of the signal busses with the frame decoder 10 and from the frame decoder 10 to the IDB 20 and to the memory core 30 are not critical to novel aspects of the present invention and depend on protocol definition or array restrictions and are therefore not described herein as being limited to any particular size.

Figure 3:
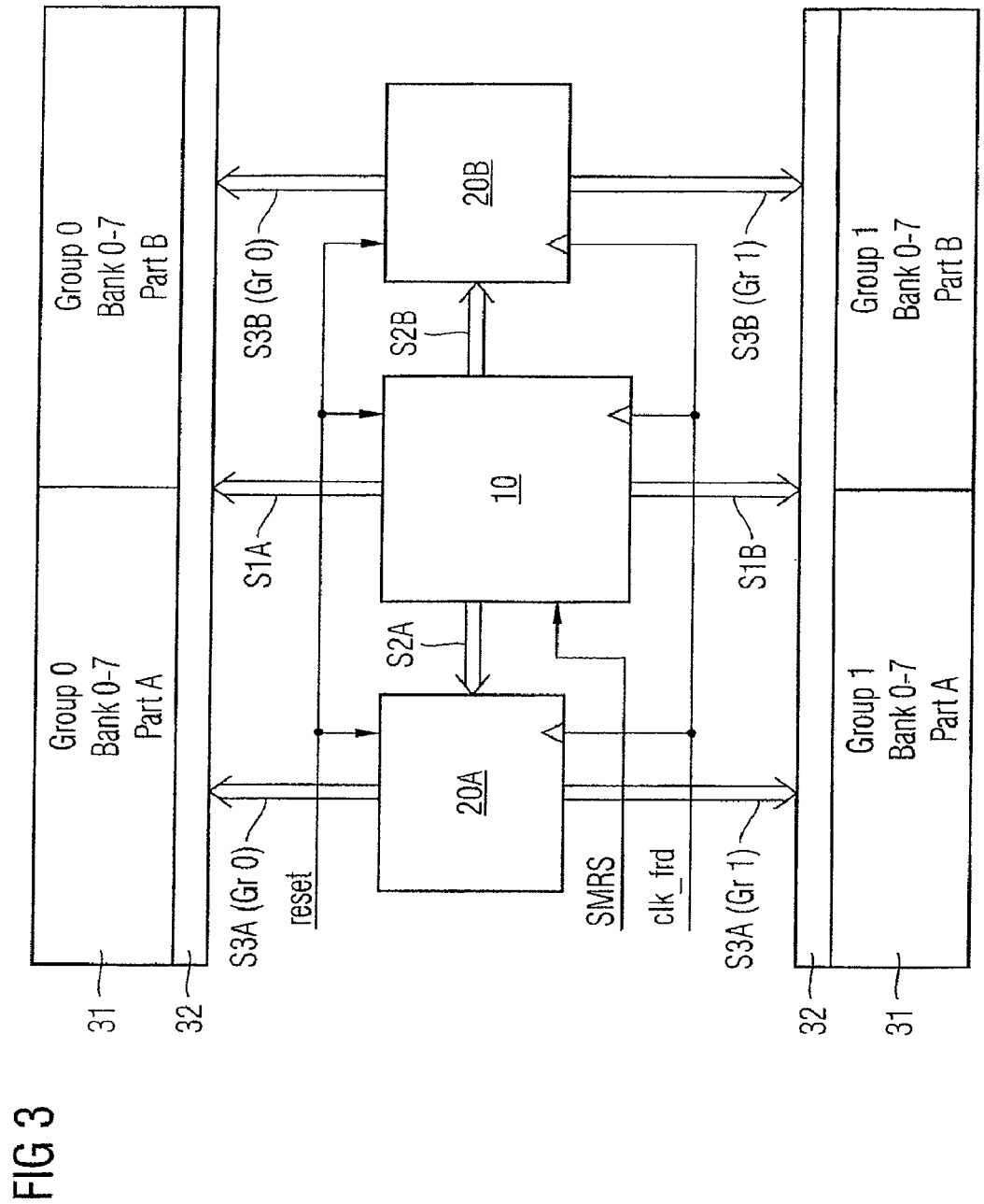
FIG. 3 shows a plan view representation of the symmetrical arrangement and partitioning of the plurality of banks of the memory core, of the first and second parts of the intermediate data buffer, and the frame decoder arranged in the center thereof.

FIG. 3 shows a plan view representation of an exemplary embodiment of the present semiconductor memory chip which includes the arrangement within the chips area of a plurality of memory banks of the memory core 30, the frame decoder 10 and the intermediate data buffer 20. In the presently preferred embodiment shown in FIG. 3, 16 memory banks are divided into two groups, upper Group 0 and lower Group 1 (upper and lower memory bank sections). Each bank is split into two parts, namely, a left part A and a right part B. The intermediate data buffer 20 is physically divided into two parts, namely, a left part 20A and a right part 20B, according to the split bank topology. For each write access to the IDB 20A, 20B, the write data are split into two parts and written concurrently by the frame decoder 10 to the left IDB 20A and the right IDB 20B. Also, the control signals S2 (FIG. 1) from the frame decoder 10 to the IDB must be doubled up for left and right (left part S2A and right part S2B of the control signals). Write access to the banks (read from the IDBs parts) also utilizes the left part 20A and the right part 20B of the IDB 20. The separation between the upper and lower groups (Group 0 and Group 1) of the memory banks has to be considered by the control logic 2 (signals S1A, S1B, S3A (GR0), S3A (GR1), S3B (GR0) and S3B (GR1)). Synchronized by the frame clock signal clk_frd, the interface to the memory banks formed by the frame decoder 10 and the left part 20A and the right part 20B of the IDB 20 is kept in a fully synchronous manner.

If, for example, 128 bit write data is read from the IDB 20, 64 bits are read from the left part 20A and 64 bits are read from the right part 20B of the IDB 20.

If the protocol defines write data mask bits and the IDB 20 is arranged for intermediately storing the write data mask bits together with and associated with intermediately stored write data units, the left part 20A of the IDB may supply 8 data mask bits together with 64 write data bits to the part A of the memory banks, and the right part 20B of the IDB 20 may supply 8 DM bits together with the 64 write data bits to the part B of the memory banks.

Notably, the plan view representation of FIG. 3 shows a symmetrical topology, where the upper Group 0 and the lower Group 1 of the memory banks 31 are respectively arranged at the left and right side of a first symmetry line (not shown) running in a first lateral direction of the memory chip which is according to FIG. 3 the horizontal direction, and the first and second part, part A and part B of the groups of memory banks 31 and the first part 20A and the second part 20B of the intermediate data buffer are respectively arranged at the left and right side of a second symmetry line (also not shown) running in a second lateral direction (the vertical direction in FIG. 3) which is substantially perpendicular to the first lateral direction.

That is, the imaginary first (horizontal) and second (vertical) symmetry lines respectively define a mirror symmetry of Group 0 and Group 1 of the memory banks and of the first part A and the second part B as well as of the first part 20A and the second part 20B of the intermediate data buffer 20 and thereby the propagation times, power distribution and access times to the memory banks are equalized and optimized due to this symmetrical topology.

While the invention has been described in detail and with reference to specific embodiments thereof, it will be apparent to one skilled in the art that various changes and modifications can be made therein without departing from the spirit and scope thereof. For example, some or all of the subject matter may be embodied as software, hardware or a combination thereof. Accordingly, it is intended that the present invention covers the modifications and variations of this invention provided they come within the scope of the appended claims and their equivalents.

What is claimed is:

1. A memory device, comprising:
   a reception interface configured to receive external data, command, and address signals in the form of serial signal frames;
   a memory core configured to retrieve and store data in accordance with read and write operations;
   a frame decoder configured to decode the command signals, the frame decoder including an interface to the memory core for supplying decoded commands; and
   an intermediate data buffer configured to temporarily store data received via the reception interface to be written to the memory core,
   wherein the interface of the frame decoder, the intermediate data buffer, and the memory core are configured to be operated synchronously via a frame clock signal.

2. The memory device of claim 1, wherein frame data including data, command, and address signals is supplied from the reception interface to the frame decoder with a frequency of the frame clock signal.

3. The memory device of claim 1, wherein the frame decoder supplies data, address, and command signals to the memory core.

4. The memory device of claim 1, wherein the frame decoder supplies write data and intermediate data buffer address signals to the intermediate data buffer.

5. The memory device of claim 1, wherein the frame decoder is configured to generate and issue control signals to the intermediate data buffer.

6. The memory device of claim 1, wherein the memory core has a split bank organization in which a total number of the memory banks is divided into an even number of groups and each group is divided into a first and second part.

7. The memory device of claim 6, wherein the intermediate data buffer is split into a first part and a second part respectively associated with the first and second part of the groups of the memory banks, and control signals are issued from the frame decoder to the first and second part of the intermediate data buffer as first and second control signals, respectively, wherein the frame decoder and the intermediate data buffer are configured to perform a read operation from one part of the groups of memory banks concurrently with a read operation from the other part of the groups of memory banks.

8. The memory device of claim 1, wherein the frame decoder comprises:

command type decoding logic configured to decode a type of one or more commands included in one or more frames and to generate control signals according to each decoded command type;

memory command evaluator/generator logic configured to schedule and prepare commands for the memory core;

intermediate data buffer command evaluator/generator logic configured to schedule and prepare control signals for the intermediate data buffer; and system command evaluator/generator logic configured to prepare and schedule system commands, wherein the memory command evaluator/generator logic, the intermediate data buffer command evaluator/generator logic, and the system command evaluator/generator logic are operated by control signals received from the command type decoding logic in accordance with the decoded type of the commands.

9. A method of operating a memory device, comprising:

receiving external data, command, and address signals in the form of serial signal frames;

decoding the command signals and supplying decoded command signals to a memory core of the memory device for accessing the memory core;

storing data received from one or more signal frames in an intermediate data buffer; and supplying the data stored in the intermediate data buffer to the memory core, wherein the receiving, decoding, storing, and supplying operations are performed synchronously using a frame clock signal.

* * * * *

UNITED STATES PATENT AND TRADEMARK OFFICE
CERTIFICATE OF CORRECTION

| | | |
|---|---|---|
| PATENT NO. | : 7,391,657 B2 | Page 1 of 1 |
| APPLICATION NO. | : 11/751984 | |
| DATED | : June 24, 2008 | |
| INVENTOR(S) | : Paul Wallner et al. | |

It is certified that error appears in the above-identified patent and that said Letters Patent is hereby corrected as shown below:

Column 5, line 31: replace "indication" with -- indication) --;

Column 5, line 41: replace "clk_rd." with -- clk_frd --;

Column 5, line 45: replace "(crc eN)" with -- crc - eN --;

Column 6, line 30: replace "-IDB relev." with -- (IDB relev --;

Column 6, line 31: replace "cmds/data" with -- cmds/data) --.

Signed and Sealed this

Twenty-first Day of October, 2008

JON W. DUDAS
*Director of the United States Patent and Trademark Office*